US012808046B2

(12) United States Patent
Kedia et al.

(10) Patent No.: US 12,808,046 B2
(45) Date of Patent: Nov. 24, 2026

(54) SEMICONDUCTOR PROCESSING DEVICE WITH HEATER

(71) Applicant: ASM IP Holding B.V., Almere (NL)

(72) Inventors: Shreyans Kedia, Tempe, AZ (US); Dinkar Nandwana, Chandler, AZ (US); Kyle Fondurulia, Phoenix, AZ (US); Todd Robert Dunn, Cave Creek, AZ (US); Jereld Lee Winkler, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 943 days.

(21) Appl. No.: 18/079,247

(22) Filed: Dec. 12, 2022

(65) Prior Publication Data

US 2023/0183863 A1 Jun. 15, 2023

Related U.S. Application Data

(60) Provisional application No. 63/265,482, filed on Dec. 15, 2021.

(51) Int. Cl.
*C23C 16/455* (2006.01)

(52) U.S. Cl.
CPC .. *C23C 16/45544* (2013.01); *C23C 16/45561* (2013.01); *C23C 16/45565* (2013.01)

(58) Field of Classification Search
CPC ........ C23C 16/45544; C23C 16/45561; C23C 16/45565
See application file for complete search history.

(56) References Cited

U.S. PATENT DOCUMENTS

| | | | | |
|---|---|---|---|---|
| 2001/0035127 | A1* | 11/2001 | Metzner | C23C 16/4557 118/725 |
| 2002/0008632 | A1* | 1/2002 | Clothier | G06K 7/0008 219/620 |
| 2003/0101938 | A1* | 6/2003 | Ronsse | C23C 16/407 118/712 |
| 2008/0202416 | A1 | 8/2008 | Provencher | |
| 2012/0289057 | A1 | 11/2012 | Dedontney | |
| 2019/0201560 | A1* | 7/2019 | Chao | A61B 6/037 |
| 2021/0301387 | A1 | 9/2021 | Barden | |
| 2022/0199443 | A1* | 6/2022 | Takebayashi | C23C 16/45578 |

FOREIGN PATENT DOCUMENTS

| | | | | |
|---|---|---|---|---|
| DE | 10239104 | B4 | 12/2006 | |
| DE | 102011013972 | A1 | 9/2012 | |
| DE | 102012013346 | A1 | 1/2014 | |
| JP | 2004063833 | A * | 2/2004 | |
| JP | 2012052669 | A | 3/2012 | |
| KR | 20090061646 | A * | 6/2009 | C23C 16/08 |
| WO | 2007131057 | A2 | 11/2007 | |
| WO | 2019055366 | A1 | 3/2019 | |

OTHER PUBLICATIONS

KR20090061646 translation (Year: 2009).*

* cited by examiner

*Primary Examiner* — Woody A Lee, Jr.
(74) *Attorney, Agent, or Firm* — Snell & Wilmer L.L.P.

(57) ABSTRACT

The present disclosure pertains to embodiments of a semiconductor deposition reactor manifold which can be used to deposit semiconductor layers using processes such as atomic layer deposition (ALD). The semiconductor deposition reactor manifold comprising heater blocks with heater elements mounted on a manifold body. Advantageously, the heater blocks are detachably mounted for easy replacement.

17 Claims, 7 Drawing Sheets

SEMICONDUCTOR PROCESSING DEVICE WITH HEATER

CROSS-REFERENCE TO RELATED APPLICATIONS

This application is a nonprovisional of, and claims priority to and the benefit of, U.S. Provisional Patent Application No. 63/265,482, filed Dec. 15, 2021 and entitled "SEMICONDUCTOR PROCESSING DEVICE WITH HEATER," which is hereby incorporated by reference herein.

BACKGROUND OF THE INVENTION

Field

The field relates generally to manifolds for vapor deposition, and, in particular, to manifolds for a pulse valve having a detachable clamshell type heater.

Background

During a typical atomic layer deposition (ALD) process, reactant pulses in vapor form are pulsed sequentially into a reaction space (e.g., a reaction chamber) through a pulse valve manifold (PVM). The manifold can be disposed within the ALD hot zone, and can be configured to deliver gases to an injector (e.g., a showerhead) for distribution into a reaction chamber. The manifold also includes one or more heaters configured to maintain thermal uniformity within the manifold for reducing the risk of decomposition or condensation within the manifold. In conventional PVMs, the heater(s) are integrated with the manifold to provide thermal energy during a reaction process.

SUMMARY

One or more aspects of the disclosed embodiments is to provide a semiconductor processing device comprising a pulse valve manifold which allows multiple chemistries to be injected into the chamber. The manifold may comprise a manifold body comprising a nickel-based alloy and one or more heater bodies may be mechanically coupled to an outer surface of the manifold body. The one or more heater bodies may comprise aluminum.

In one embodiment, the semiconductor processing device comprises a pulse valve manifold may comprise a manifold body which may comprise a bore configured to deliver vaporized reactant to a reaction chamber. The bore may comprises an inlet at a first end of the bore in an upper portion of the manifold and an outlet at a second end of the bore in a lower portion of the manifold. The manifold body may further comprise a first supply channel configured to supply gas to the bore and a second supply channel configured to supply gas to the bore. The heater body may be detachably mounted on the outer surface of the manifold. In another embodiment, a first heater block may be detachably mounted on a first outer surface of the manifold body and a second heater block may be detachably mounted on a second outer surface of the manifold that is opposite the first outer surface. The semiconductor processing device may comprise a first valve block mounted on the manifold body being fluidly connected with the first supply channel and a second valve block mounted on the manifold body being connected with the second supply channel.

Another object of one or more aspects of the present invention is to a semiconductor processing method for delivering a vaporized reactant to a reaction chamber through the manifold body having a detachably mounted heater body on the outer surface of the manifold body. In one embodiment, the method may include servicing heating elements of a pulse valve manifold for a semiconductor processing device.

BRIEF DESCRIPTION OF THE DRAWINGS

The foregoing and other objectives and advantages will appear from the description to follow. In the description reference is made to the accompanying drawing, which forms a part hereof, and in which is shown by way of illustration specific embodiments in which the disclosed embodiments may be practiced. These embodiments will be described in sufficient detail to enable those skilled in the art to practice the disclosed embodiments, arid it is to be understood that other embodiment may be utilized and the structural changes may be made without departing from the scope of the disclosed embodiments, The accompanying drawings, therefore, are submitted merely as showing the preferred exemplification of the disclosed embodiments. Accordingly, the following detail description is not to be taken in a limiting sense, and the scope of the disclosed embodiments is best defined by the appended claims.

DETAILED DESCRIPTION OF THE PREFERRED EMBODIMENT

Various embodiments disclosed herein relate to a semiconductor device, such as a vapor deposition device (e.g., an ALD device, a CVD device, etc.), that includes a manifold for delivering reactant vapor(s) to a reaction chamber. Regardless of the natural state of the chemicals under standard conditions, the reactant vapors may be referred to as "gases" herein. The embodiments disclosed herein can beneficially provide the first reactant mid the second reactant through a first supply channel and a second supply channel, respectively, that communicate with a bore of the manifold. The first and second supply channels can supply first and second reactant vapors, respectively, to the manifold. Moreover, the first and second supply channels can also supply purge gas(es) (for example, inert carrier gases) to the manifold to purge the manifold and supply channels of reactant.

Pulse valve manifolds (PVMs) are used in atomic layer deposition (ALD) tools to sequentially provide the supply or to stop the supply of gases to a reaction chamber. Conventional pulse valve manifolds have integrated heaters and in cases of maintenance or other problems, the PVMs are removed from the processing system to service the integrated heater(s), which causes a significant amount of downtime. Accordingly, the proper functioning of the PVM and reducing system downtime and cost are important to obtain suitable wafer yield and throughput. Further, some PVMs utilize O-ring connections which may be made of, e.g., rubber or any polymeric material, and are not as robust as C-seals, which are made of e.g., stainless steel or Hastealloy C22® manufactured by CSI. Although PVMs can be made from a Nickel-Chromium Molybdenum alloy, which can be used to deliver materials that may react with stainless steel, the Nickel-Chromium Molybdenum alloy is costly and difficult to machine in very large blocks.

Figure 1:
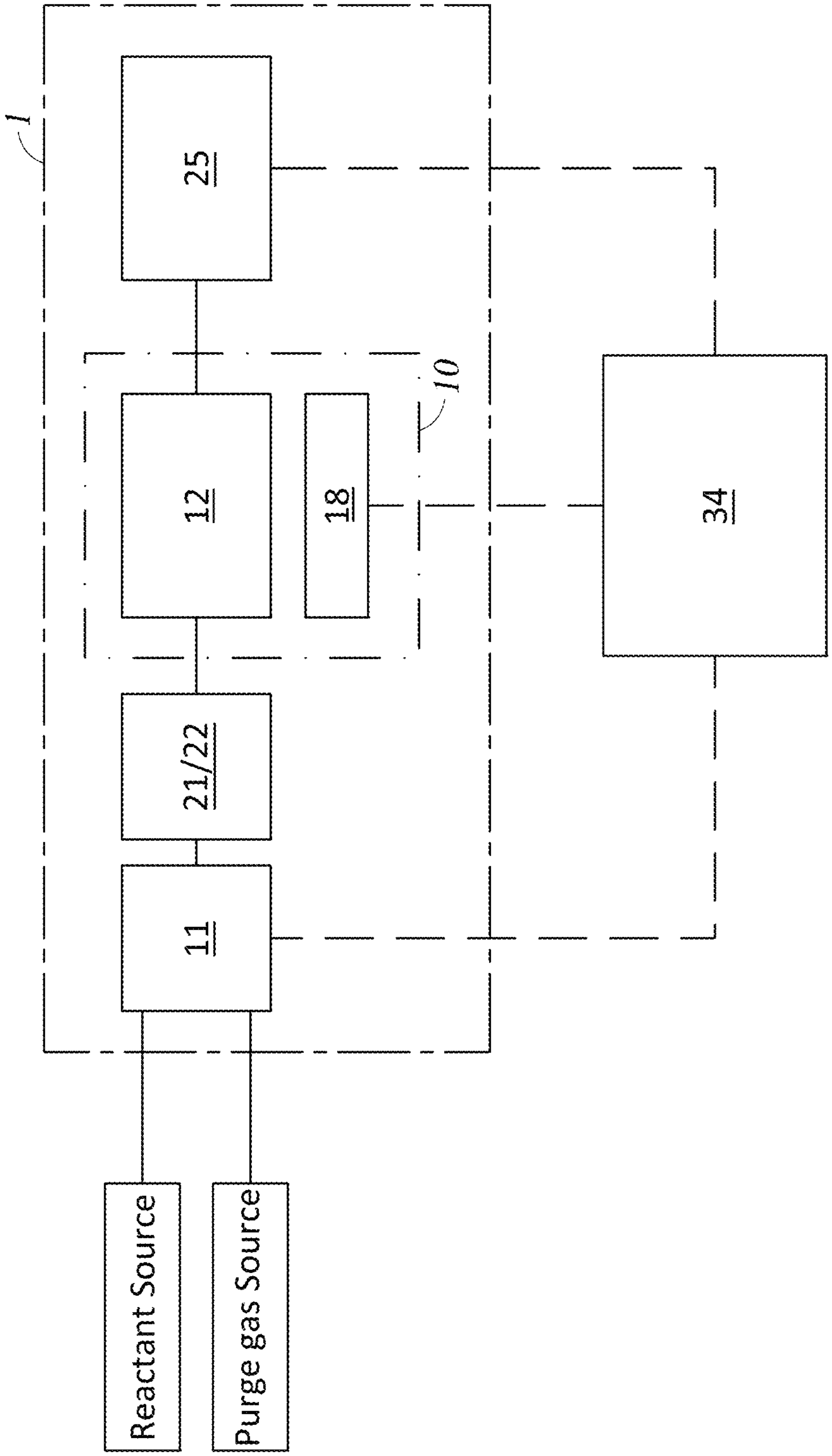
FIG. 1 is a block diagram of a semiconductor processing device in accordance with various embodiments, including a reactant source and a purge gas source.

FIG. 1 shows a block diagram of a semiconductor processing device in accordance with various embodiments, including a reactant source and a purge gas source. The reactant source can be liquid or solid sources, which can be vaporized to supply vaporized reactant to the reaction chamber 25 by way of a manifold body 12. In various embodiments, multiple reactant sources can be connected to the device. As shown in FIG. 1, a control system 34 can control the operation of various components of the device 1, including valves 11, reaction chamber 25, and heating blocks 18. The detail of the each component will be discussed below. The control system 34 can comprise processing electronics (including a processor and one or more memory devices) configured to control the operation each component.

Figure 2:
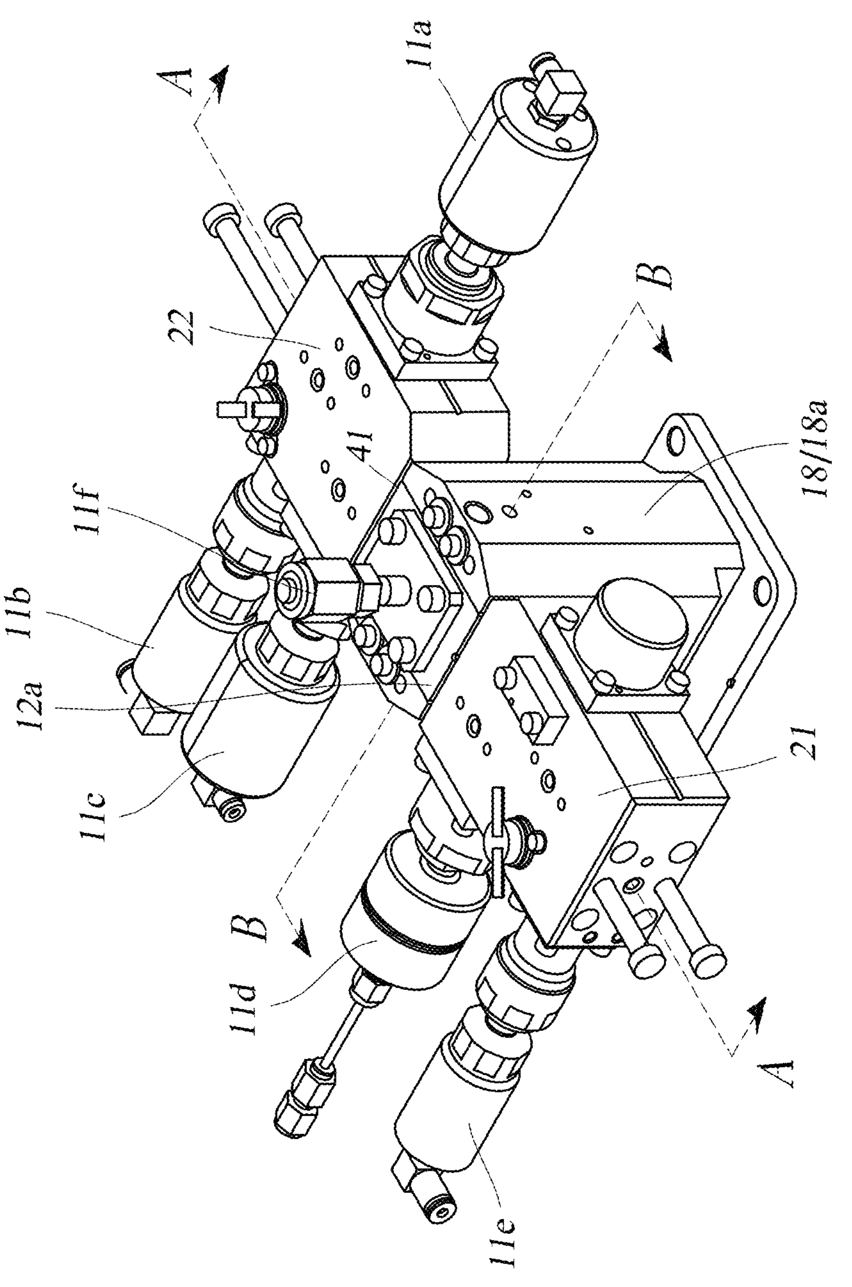
FIG. 2 is a schematic perspective view of an illustrative embodiment of the manifold body and the heater blocks with valve blocks mounted on the manifold body.
Figure 3:
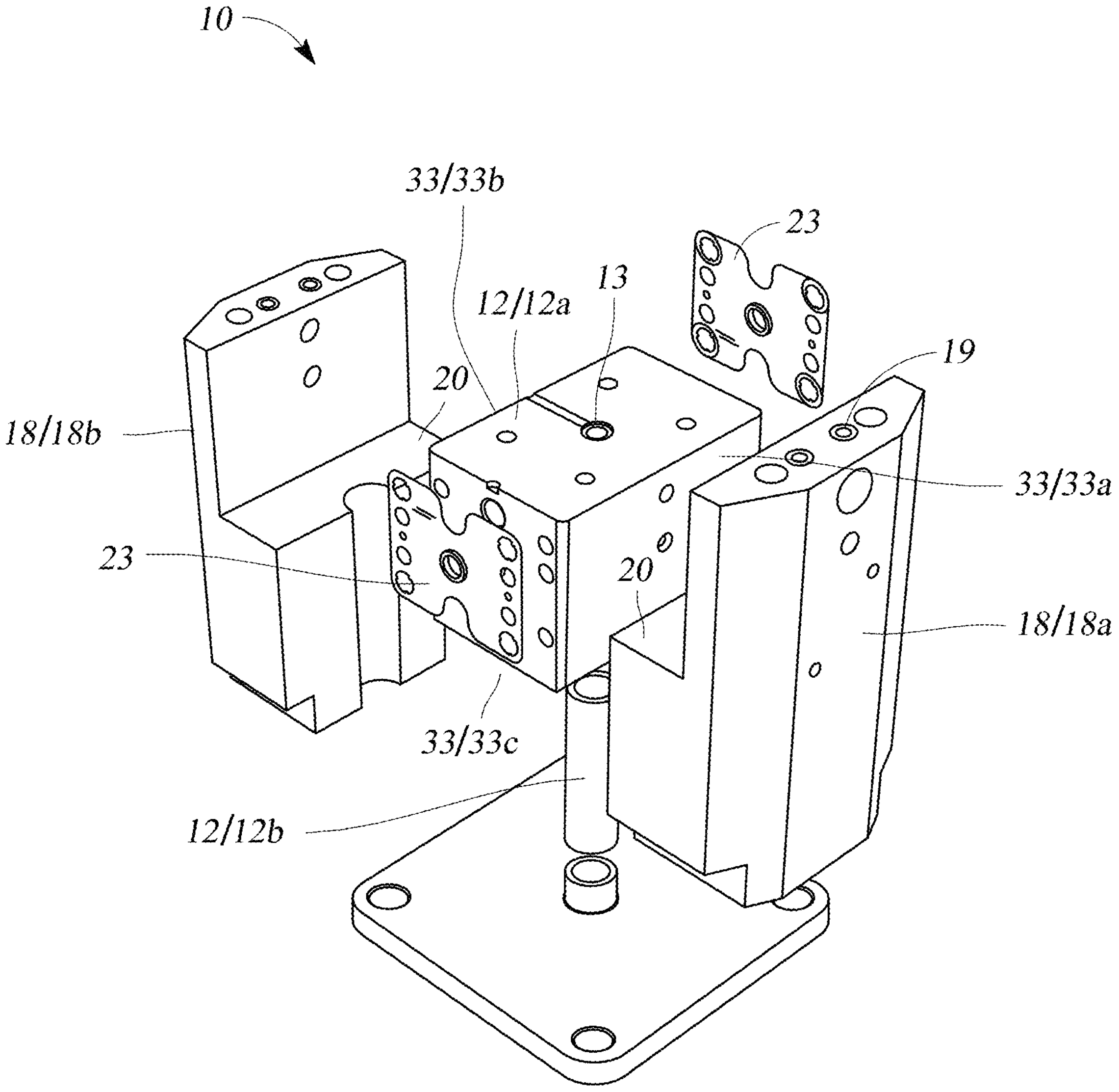
FIG. 3 is a schematic perspective exploded view of an illustrative embodiment of the manifold body and the heater blocks.
Figure 4:
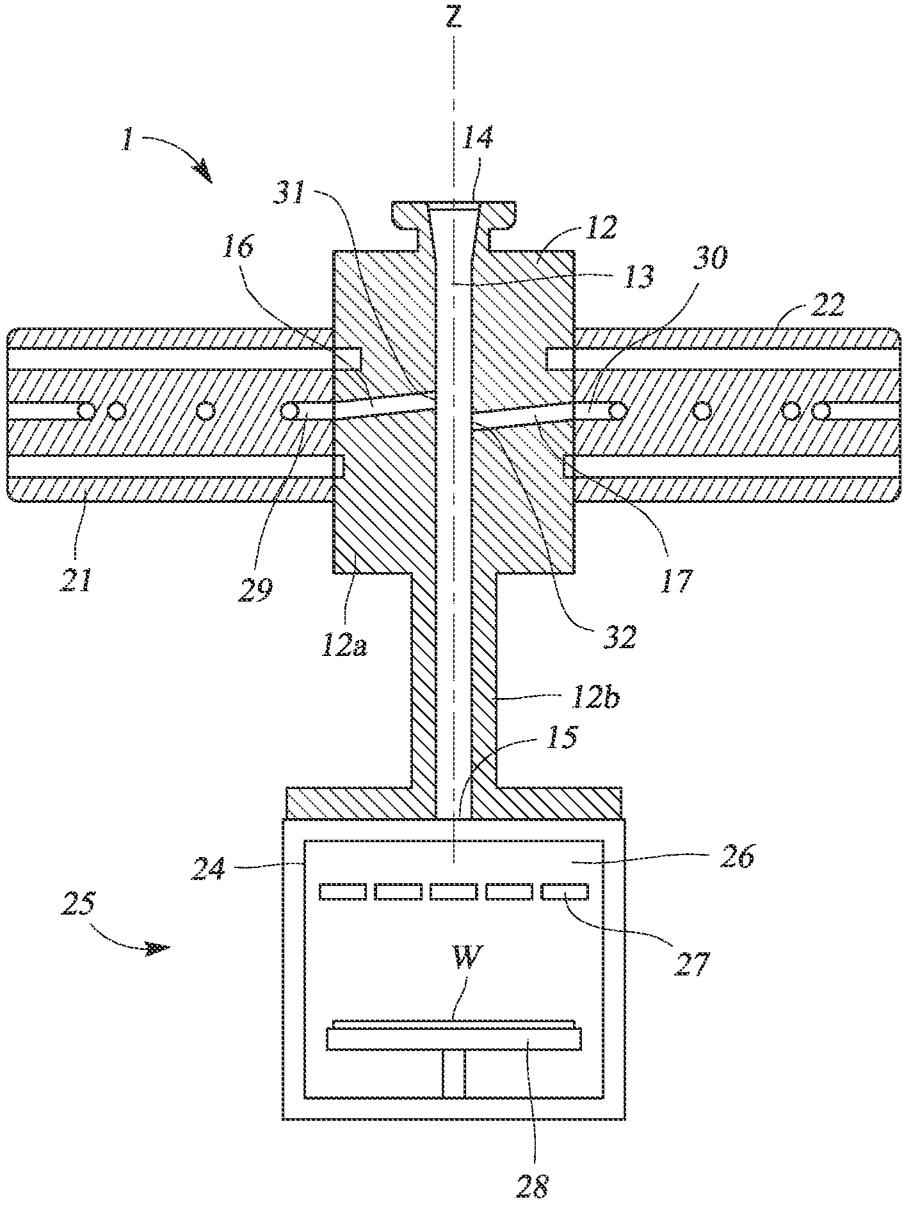
FIG. 4 is a cross-sectional view of a portion of the semiconductor processing device of FIG. 2, taken along section A-A.
Figure 5:
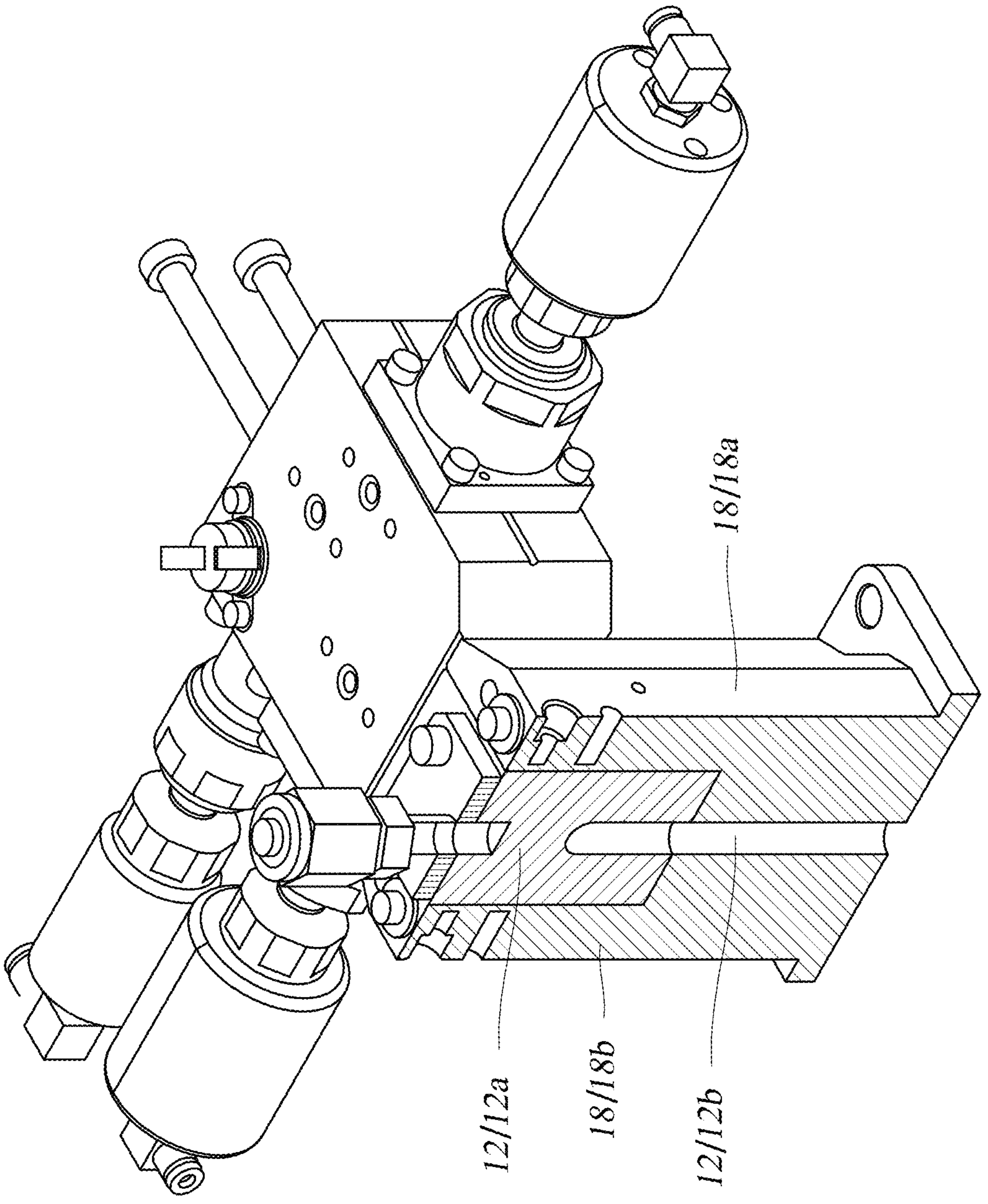
FIG. 5 is a cross-sectional view of a portion of the semiconductor processing device of FIG. 2, taken along section B-B

FIG. 2 is a perspective view of a semiconductor processing device 1 that can include a pulse valve manifold 10 to deliver gases to a reaction chamber 25 shown in FIG. 4. Various components of FIGS. 1, 2, and 4 are described in detail below in connection with the description of FIG. 3. For example, the semiconductor processing device 1 can include a manifold 10 comprising a manifold body 12. First and second valve blocks 21, 22 can be mounted to the manifold body 12 and can include one or a plurality of vapor phase inlet openings 31, 32 to deliver reactant vapor and/or inactive gas (e.g., purge gas) to the manifold body 12. The semiconductor processing device 1 can comprise a dispersion device 24, such as a showerhead can include a plenum 26 in fluid communication with a plurality of openings 27. The semiconductor processing device 1 can further include a plurality of valves 11*a*-11*f* to control the delivery of reactant vapor and inactive gas to the manifold body 12. The manifold body 12 can comprises a top rectangular parallelepiped portion 12*a* and a bottom cylindrical portion 12*b*. The bottom cylindrical portion 12*b* comprises a pipe member forming a portion of the bore 13 that delivers gas(es) to the reaction chamber 15. The bottom cylindrical portion 12*b* can be coupled to a bottom surface 33*c* of the top rectangular parallelepiped portion 12*a* so as to receive the vaporized reactant from the top rectangular parallelepiped portion 12*a*. The valve blocks 21, 22 can be mounted to the top rectangular parallelepiped portion 12*a* to deliver gas(es) to the top rectangular parallelepiped portion 12*a*.

FIG. 3 is a schematic side view of a semiconductor processing device 1 that can include the pulse valve manifold 10 to deliver a gas to a reaction chamber 25, including a sectional view taken along section A-A of FIG. 1. The pulse valve manifold 10 can include the manifold body 12 connected with valve blocks 21, 22, shown on opposite sides of the manifold body 12. The plurality of valves 11*a*-11*f* (not shown) can be disposed on the valve blocks 21, 22 and on the manifold body 12. The manifold body 12 can comprises a bore 13 configured to deliver vaporized reactant to a reaction chamber 25, the bore 13 extends along a longitudinal axis Z of the manifold body 12. The manifold body 12 can further comprise an inlet 14 at a first end of the bore 13 in an upper portion of the manifold body 12 and an outlet 15 at a second end of the bore 13 in a lower portion of the manifold body 12. The inlet 14 can supply inert gas or reactant vapor to the bore 13, where the inert gas or the reactant vapor flows through the bore 13 and exits the manifold body 12 through the outlet 15. The outlet 15 can be disposed over a dispersion mechanism, such as the showerhead, which can disperse the gas over the substrate W in a reaction chamber 25.

The manifold body 12 can comprise a first supply channel 16 configured to supply gas to the bore 13, and a second supply channel 17 configured to supply gas to the bore 13. The first supply channel 16 and the second supply channel 17 can be in fluid connection with supply ports 29 and 30 located in the first valve block 21 and the second valve block 22, respectively. The first and second supply channels 16, 17 can be disposed anywhere along the length of the bore, e.g., may not be misaligned/not offset, and can merge with the bore 13 at approximately the same region along the longitudinal axis of the manifold body 12, but inlet openings 31, 32 into the bore 13 can be slightly offset along the longitudinal axis. Alternatively, the first supply channel 16 and second supply channel 17 can be fabricated to be at different levels and arrive at staggered positions at the bore 13. Therefore, the first supply channel 16 and second supply channel 17 can be angled upwards, downwards, or straight across, and can merge with the bore 13 at offset positions along the longitudinal axis. As shown in FIG. 3, the bore 13 can extend continuously along the longitudinal axis, such that the bore 13 does not include any turns or curved pathways.

The manifold body 12 can comprise a single or a plurality of heater blocks 18*a*, 18*b* detachably mounted on an outer surface 33 of the manifold body 12. As shown in FIG. 2, a first heater block 18*a* may be mechanically coupled to a first outer surface 33*a* of the manifold body 12, and a second heater block 18*b* may be mechanically coupled to a second outer surface 33*b* of the manifold body 12. The single or the plurality of heater blocks 18*a*, 18*b* are heating blocks comprising heating elements 19, such as heating rods in them to heat the manifold body 12. The single or the plurality of heater blocks 18*a*, 18*b* can be detachably mounted on the outer surface 33 of the manifold body 12 with a gap (e.g., gap 41) therebetween and not exposed to a wetted stream of chemistry. The gap may be filled with a thermal paste. The single or the plurality of heater blocks 18*a*, 18*b* may not physically contact the manifold body 12 to create an oven type of system around the manifold body 12. A ring shape space can be formed between the bottom cylindrical portion 12*b* and the heater blocks 18*a*, 18*b*, which improves heat distribution due to an oven-like atmosphere. Each heater block 18*a*, 18*b* can comprise a ledge 20 on a surface facing the manifold body 12 such that the ledge 20 faces the bottom surface 33*c* of the top rectangular parallelepiped portion 12*a*. Thus, a surface area of the heater block 18 facing the manifold body 12 can be increased. The plurality of heater blocks 18*a*, 18*b* can be placed using one or more screws going through to the manifold body 12 for easy installation and removal. Thus, in case of problems or maintenance needs for the heater, the heater blocks 18*a*, 18*b* can be readily replaced to resolve the problem instead of replacing the manifold 10.

A material of the single or the plurality of heater blocks 18*a*, 18*b* can have a high thermal conductivity, e.g., aluminum. A thermal conductivity of the plurality of heater blocks 18*a*, 18*b* can be higher than that of the manifold body 12. The manifold body 12 can comprise a first material, for example a nickel based alloy, e.g., nickel-iron alloy such as Hastelloy C22® manufactured by CSI, while each heater block 18*a*, 18*b* can comprise a second material, for example aluminum. As shown in FIG. 1, the use of the Hastelloy C22® allows the first and second valve blocks 21, 22 to mechanically connect to the manifold body 120 without the use of O-rings.

Conventional pulse valve manifolds are made of stainless steel. However, pulse valve manifolds have a complex geometry which is difficult to manufacture and assemble, and further, a coat is typically used to protect the metal from plasma. It is important to use a material for the manifold body that is highly corrosion resistant to various kind of precursors and sufficiently hard so as to support the use of metallic C-seals.

In various embodiments, the disclosed manifold body 12 can be made in such a way that only a wetted part and the sealing surfaces are made of the nickel based alloy material while the separate heater block(s) can be made of another material (such as Aluminum material) to reduce cost. Making sealing surface from a nickel-based alloy allows for use of C-seals, which are more robust as compared to conventional O-rings. In some embodiments, for example, metal seals 23 can be used between the manifold body 12 and the first and second valve blocks 21, 22. The metal seals 23 can be C-seals comprising a nickel based alloy or stainless steel. It is important that C-seals bear against a hard surface so that the C-seals expand into the sealing surfaces. Although Hastelloy C22® has a hardness appropriate for a metal seal, additional hardening may be provided to make it much harder where it seals to improve the seal efficiency. A surface hardness of contact areas of the C-seals on the manifold body 12 is preferably larger than 300 Vickers Hardness (Hv).

The present disclosure also relates to a method for delivering a vaporized reactant to a reaction chamber through the manifold body having a detachably mounted heater body on the outer surface of the manifold body, and a method for servicing (e.g., replacing or otherwise maintaining) heating elements in heater block(s) of a pulse valve manifold for a semiconductor processing device.

Figure 6:
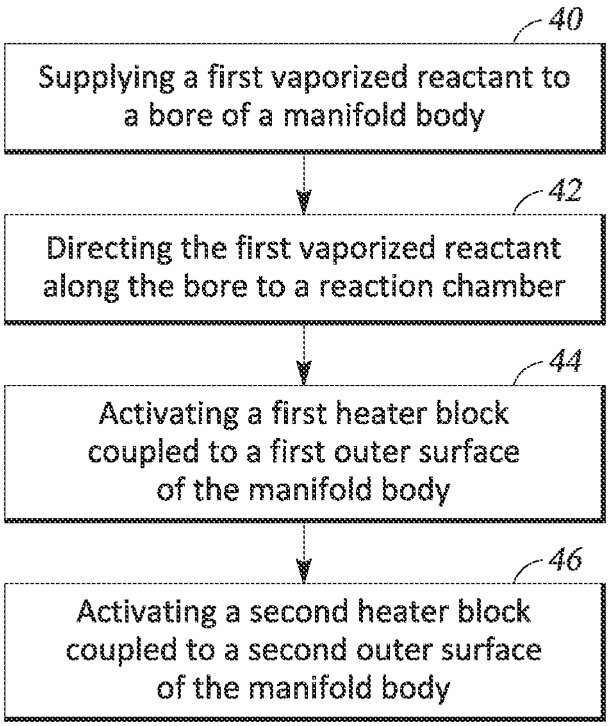
FIG. 6 is a flow chart showing steps for operating heater blocks coupled to a manifold, in accordance with one embodiment
Figure 7:
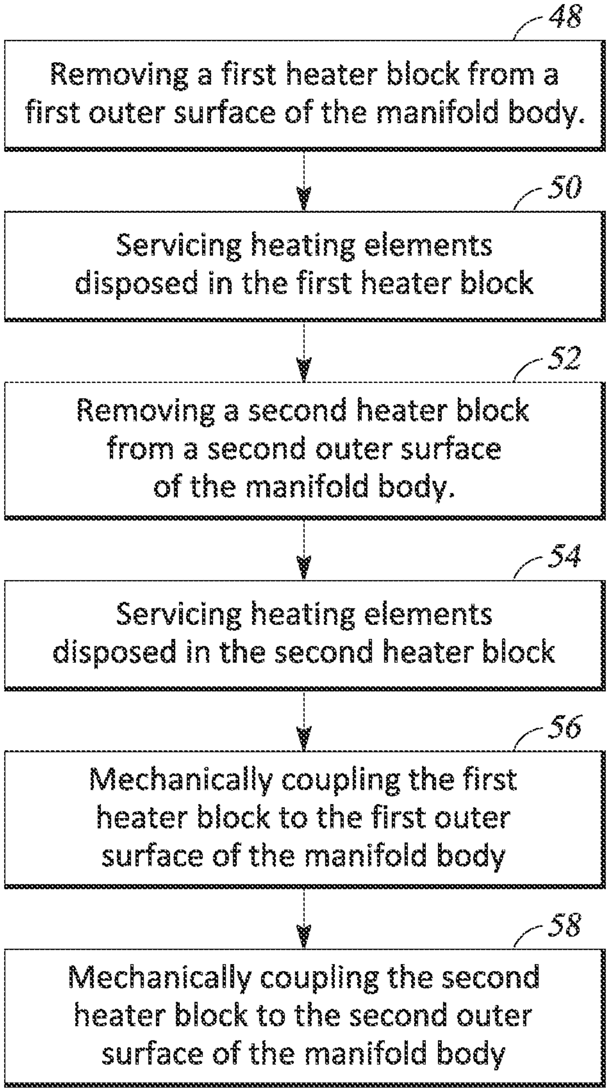
FIG. 7 is a flow chart showing steps for servicing heater blocks coupled to a manifold, in accordance with one embodiment.

FIG. 6 is a flow chart generally illustrating a method for delivering a vaporized reactant to a reaction chamber 25 through the manifold 10. At block 40, a first vaporized reactant is supplied to a bore 13 extending along a longitudinal axis Z of a manifold body 12. At block 42, the first vaporized reactant is directed to a reaction chamber 25 along the bore. At block 44, a first heater block 18(*a*) is mechanically coupled to a first outer surface 33(*a*) of the manifold body 12. The first heater block 18(*a*) can be activated by the control system 34 so as to transfer heat to the manifold body 12. At block 46, a second heater block 18(*b*) can be mechanically coupled to a second outer surface 33(*b*) of the manifold body 12. The second heater block 18(*b*) can be activated by the control system 34 so as to transfer heat to the manifold body 12. It should be appreciated that, although FIG. 6 illustrates the activation of both heater blocks 18(*a*), 18(*b*), in some embodiments, only one of the heater blocks 18(*a*), 18(*b*) may be activated during the operation. Moreover, although only two heater blocks are shown herein, it should be appreciated that in other embodiments, more than two heater blocks can be coupled to the manifold FIG. 7 is a flow chart generally illustrating a method for servicing the heating element(s) 19 disposed in the heater blocks 18 in accordance with one embodiment. At block 48, the first heater block 18*a* is removed from the first outer surface 33(*a*) of the manifold body 12. At block 50, the heating elements disposed in the first heater block 18(*a*) can be serviced (e.g., replaced). At block 52, the second heater block 18*b* is removed from the second outer surface 33(*b*) of the manifold body 12. At block 54, the heating elements disposed in the second heater block 18(*b*) can be serviced (e.g., replaced). At block 56, the first heater block 18(*a*) is mechanically coupled to the first outer face 33(*a*) of the manifold body 12. At block 58, the second heater block 18(*a*) is mechanically coupled to the second outer face 33(*b*) of the manifold body 12. Thus, beneficially, if there are problems or maintenance issues related to the heating elements, one or both of the heater blocks 18*a*, 18*b* can be readily replaced to resolve the problem instead of replacing the manifold 10. It should be appreciated that, although FIG. 7 illustrates the servicing of both heater blocks 18(*a*), 18(*b*), in some embodiments, only one of the heater blocks 18(*a*), 18(*b*) may be serviced during a maintenance procedure. Moreover, although only two heater blocks are shown herein, it should be appreciated that in other embodiments, more than two heater blocks can be coupled to the manifold.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted fairly based on the language employed in the claims and not limited to the examples described in the present specification or during the prosecution of the application, which examples are to be construed as non-exclusive.

What is claimed is:

1. A semiconductor processing device, comprising:
a manifold body comprising a first material, the manifold body comprising:
a top rectangular parallelepiped portion and a bottom cylindrical portion;
a bore extending along a longitudinal axis of the manifold body, wherein the bottom cylindrical portion comprises a pipe member forming a portion of the bore and coupled to a bottom surface of the top rectangular parallelepiped portion;
a first supply channel configured to supply a first vaporized reactant to the bore; and
an outlet at a lower end of the bore; and
a heater block mechanically coupled to an outer surface of the manifold body, the heater block being configured to transfer heat to the manifold body, the heater block comprising a second material different from the first material and a ledge on a surface facing the manifold body such that the ledge faces the bottom surface of the top rectangular parallelepiped portion.

2. The semiconductor processing device according to claim 1, wherein:
the heater block is detachably mounted on the manifold body with a gap therebetween; and
the heater block comprises a heating element.

3. The semiconductor processing device according to claim 1, wherein a thermal conductivity of the second material is higher than that of the first material.

4. The semiconductor processing device according to claim 1, wherein the first material comprises a nickel-based alloy and the second material comprises aluminum.

5. The semiconductor processing device according to claim 1, wherein the manifold body is configured to connect to a first valve block to fluidly connect with the first supply channel and to connect to a second valve block to fluidly connect with a second supply channel.

6. The semiconductor processing device according to claim 5, further comprising a first C-seal and a second C-seal, wherein the first C-seal is disposed between the manifold body and the first valve block and the second C-seal is disposed between the manifold body and the second valve block.

7. The semiconductor processing device according to claim 6, wherein a surface hardness of contact areas of each of the C-seals on the manifold body is set larger than 300 Hv.

8. A semiconductor processing device capable of connecting to a reaction chamber, comprising:
a manifold body comprising:
a top rectangular parallelepiped portion and a bottom cylindrical portion;
a bore configured to be in fluid communication with the reaction chamber, the bore extending along a longitudinal axis of the manifold body, wherein the bottom cylindrical portion comprises a pipe member forming a portion of the bore and coupled to a bottom surface of the top rectangular parallelepiped portion;
a first supply channel configured to supply a first vaporized reactant to the bore; and
an outlet at a lower end of the bore to convey the first vaporized reactant to the reaction chamber;
a first heater block mechanically coupled to a first outer surface of the manifold body, the first heater block being configured to transfer heat to the manifold body; and
a second heater block mechanically coupled to a second outer surface of the manifold body that is opposite the first outer surface, the second heater block being configured to transfer heat to the manifold body,
wherein each of the first and second heater blocks comprises a ledge on a surface facing the manifold body such that the ledge faces the bottom surface of the top rectangular parallelepiped portion.

9. The semiconductor processing device according to claim 8, wherein the manifold body is configured to connect to a first valve block to fluidly connect with the first supply channel.

10. The semiconductor processing device according to claim 9, further comprising a second supply channel configured to supply a second vaporized reactant to the bore, wherein the manifold body is configured to connect to a second valve block to fluidly connect with the second supply channel.

11. The semiconductor processing device according to claim 8, wherein each of the first and second heater blocks is detachably mounted on the manifold body with a gap therebetween.

12. The semiconductor processing device according to claim 8, wherein each of the first and second heater blocks comprises a heating element.

13. The semiconductor processing device according to claim 8, wherein a thermal conductivity of each of the first and second heater blocks is higher than that of the manifold body.

14. The semiconductor processing device according to claim 10, further comprising a first C-seal and a second C-seal, wherein the first C-seal is disposed between the manifold body and the first valve block and the second C-seal is disposed between the manifold body and the second valve block.

15. The semiconductor processing device according to claim 14, wherein a surface hardness of contact areas of the C-seals on the manifold body is set larger than 300 Hv.

16. A semiconductor processing device, comprising:
a manifold body comprising a first material, the manifold body comprising:
a bore extending along a longitudinal axis of the manifold body;
a first supply channel configured to supply a first vaporized reactant to the bore; and
an outlet at a lower end of the bore,
wherein the manifold body is configured to connect to a first valve block to fluidly connect with the first supply channel and to connect to a second valve block to fluidly connect with a second supply channel;
a heater block mechanically coupled to an outer surface of the manifold body, the heater block being configured to transfer heat to the manifold body, the heater block comprising a second material different from the first material; and
a first C-seal and a second C-seal, wherein the first C-seal is disposed between the manifold body and the first valve block and the second C-seal is disposed between the manifold body and the second valve block.

17. A semiconductor processing device capable of connecting to a reaction chamber, comprising:

a manifold body comprising:

a bore configured to be in fluid communication with the reaction chamber, the bore extending along a longitudinal axis of the manifold body;

a first supply channel configured to supply a first vaporized reactant to the bore; and an outlet at a lower end of the bore to convey the first vaporized reactant to the reaction chamber, wherein the manifold body is configured to connect to a first valve block to fluidly connect with the first supply channel and to connect to a second valve block to fluidly connect with a second supply channel;

a first heater block mechanically coupled to a first outer surface of the manifold body, the first heater block being configured to transfer heat to the manifold body;

a second heater block mechanically coupled to a second outer surface of the manifold body that is opposite the first outer surface, the second heater block being configured to transfer heat to the manifold body; and a first C-seal and a second C-seal, wherein the first C-seal is disposed between the manifold body and the first valve block and the second C-seal is disposed between the manifold body and the second valve block.

* * * * *